United States Patent [19]
Wood et al.

[11] Patent Number: 5,585,282
[45] Date of Patent: Dec. 17, 1996

[54] PROCESS FOR FORMING A RAISED PORTION ON A PROJECTING CONTACT FOR ELECTRICAL TESTING OF A SEMICONDUCTOR

[75] Inventors: Alan G. Wood; Trung T. Doan, both of Boise; Warren M. Farnworth, Nampa; Tim J. Corbett, Boise, all of Id.

[73] Assignee: Micron Technology, Inc., Boise, Id.

[21] Appl. No.: 406,637

[22] Filed: Mar. 20, 1995

Related U.S. Application Data

[63] Continuation of Ser. No. 137,675, Oct. 14, 1993, abandoned, which is a continuation-in-part of Ser. No. 709,858, Jun. 4, 1991, abandoned, Ser. No. 788,065, Nov. 5, 1991, Pat. No. 5,440,240, and Ser. No. 981,956, Nov. 24, 1992, Pat. No. 5,539,324.

[51] Int. Cl.⁶ .................. H01L 21/28; H01L 21/308; H01L 21/66
[52] U.S. Cl. .............. 437/8; 437/183; 437/216; 437/222; 437/977
[58] Field of Search ............... 437/8, 183, 216, 437/222, 977; 257/739, 785; 228/180.22

[56] References Cited

U.S. PATENT DOCUMENTS

| | | | |
|---|---|---|---|
| 3,581,151 | 5/1971 | Boyle et al. | 317/234 |
| 4,063,271 | 12/1977 | Bean et al. | 357/49 |
| 4,189,825 | 2/1980 | Robillard et al. | 437/8 |
| 4,312,117 | 1/1982 | Robillard et al. | 29/589 |
| 4,585,991 | 4/1986 | Reid et al. | 156/647 X |
| 4,881,118 | 11/1989 | Niwayama et al. | 257/739 |
| 4,924,589 | 5/1990 | Leedy | 29/832 |
| 4,929,999 | 5/1990 | Hoeberechts et al. | 437/222 |
| 4,937,653 | 6/1990 | Blonder et al. | 257/739 |
| 4,952,272 | 8/1990 | Okino et al. | 156/630 |
| 4,963,225 | 10/1990 | Lehman-Lamer | 156/630 |
| 5,014,161 | 5/1991 | Lee et al. | 361/388 |
| 5,045,780 | 9/1991 | Swart | 324/159 P |
| 5,059,898 | 10/1991 | Barsotti et al. | 324/158 P |
| 5,070,297 | 12/1991 | Kwon et al. | 324/158 P |
| 5,072,116 | 12/1991 | Kawade et al. | 250/306 |
| 5,073,117 | 12/1991 | Malhi | 439/71 |
| 5,088,190 | 2/1992 | Malhi et al. | 29/843 |
| 5,103,557 | 4/1992 | Leedy | 29/832 |
| 5,123,850 | 6/1992 | Elder et al. | 439/67 |
| 5,177,438 | 1/1993 | Littlebury et al. | 324/158 P |
| 5,177,439 | 1/1993 | Liu et al. | 324/158 P |
| 5,225,037 | 7/1993 | Elder et al. | 156/644 |
| 5,262,718 | 11/1993 | Svendsen et al. | 324/158 P |
| 5,323,035 | 6/1994 | Leedy | 257/248 |
| 5,326,428 | 7/1994 | Farnworth et al. | 156/654 |

FOREIGN PATENT DOCUMENTS

| | | | |
|---|---|---|---|
| 329314 | 8/1989 | European Pat. Off. | 437/216 |
| 57-143838 | 9/1982 | Japan | 437/183 |
| 25540 | 1/1990 | Japan | 437/183 |
| 2232946 | 9/1990 | Japan | 437/183 |
| 0369131 | 3/1991 | Japan . | |
| 410446 | 1/1992 | Japan | 437/183 |

*Primary Examiner*—John Niebling
*Assistant Examiner*—David E. Graybill
*Attorney, Agent, or Firm*—Stephen A. Gratton

[57] ABSTRACT

A process for forming die contacting substrate for establishing ohmic contact with the die is formed with raised portions on contact members. The raised portions are dimensioned so that a compression force applied to the die against the substrate results in a limited penetration of the contact member into the bondpads. In the preferred embodiment, the substrate is formed of semiconductor material, with the raised portions being formed by etching. The arrangement may be used for establishing temporary electrical contact with a burn-in oven and with a discrete die tester. This permits the die to be characterized prior to assembly, so that the die may then be transferred in an unpackaged form. A Z-axis anisotropic conductive interconnect material may be interposed between the die attachment surface and the die.

20 Claims, 4 Drawing Sheets

PROCESS FOR FORMING A RAISED PORTION ON A PROJECTING CONTACT FOR ELECTRICAL TESTING OF A SEMICONDUCTOR

CROSS-REFERENCE TO RELATED APPLICATION

This is a continuation of application Ser. No. 08/137,675 filed Oct. 14, 1993, abandoned, which is a continuation-in-part of U.S. patent application Ser. No. 7/709,858, filed Jun. 4, 1991, abandoned; U.S. patent application Ser. No. 7/788,065, filed Nov. 5, 1991, U.S. Pat. No. 5,440,240; and U.S. patent application No. 7/981,956, filed Nov. 24, 1992. U.S. Pat. No. 5,539,324.

FIELD OF THE INVENTION

This invention relates to packaging for semiconductor devices. More specifically, the invention relates to a bondpad contact which is self-limiting in its penetration into bondpads or other contact points on a semiconductor die.

BACKGROUND OF THE INVENTION

Semiconductor devices are subjected to a series of test procedures in order to assure quality and reliability. This testing procedure conventionally includes "probe testing", in which individual dies, while still on a wafer, are initially tested to determine functionality and speed. Probe cards are used to electrically test die at that level. The electrical connection interfaces with only a single die at a time in the wafer; not discrete die.

If the wafer has a yield of functional dies which indicates that quality of the functional dies is likely to be good, each individual die is assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (DUT) at elevated temperatures, thus eliminating potential failures which would not otherwise be apparent at nominal test conditions.

Variations on these procedures permit devices assembled onto circuit arrangements, such as memory boards, to be burned-in, along with the memory board in order to assure reliability of the circuit, as populated with devices. This closed assembly testing assumes that the devices are discretely packaged in order that it can then be performed more readily.

If the wafer has a yield of grossly functional die, it indicates that a good quantity of die from the wafer are likely to be fully operative. The die are separated with a die saw, and the nonfunctional die are scrapped, while the rest are individually encapsulated in plastic packages or mounted in ceramic packages with one die in each package. After the die are packaged they are rigorously electrically tested. Components which turn out to be nonfunctional, or which operate at questionable specifications, are scrapped or devoted to special uses.

Packaging unusable die, only to scrap them after testing, is a waste of time and materials, and is therefore costly. Given the relatively low profit margins of commodity semiconductor components such as dynamic random access memories (DRAMs) and static random access memories (SRAMs), this practice is uneconomical. However, no thorough and cost effective method of testing an unpackaged die is available which would prevent this unnecessary packaging of nonfunctional and marginally functional die. Secondly, the packaging may have other limitations which are aggravated by burn-in stress conditions, so that the packaging becomes a limitation for burn-in testing.

It is proposed that multiple integrated circuit devices be packaged as a single unit, known as a multi chip module (MCM). This can be accomplished with or without conventional lead frames. This creates two problems when using conventional test methods. Firstly, discrete testing is more difficult because a conventional lead frame package is not used. Furthermore, when multiple devices are assembled into a single package, the performance of the package is reduced to that of the die with the lowest performance. Therefore, such dies are tested on an individual basis at probe, using ambient and "hot chuck" test techniques, while still in wafer form. In other words, the ability to presort the individual dice is limited to that obtained through probe testing.

In addition, there is an increased interest in providing parts which are fully characterized prior to packaging. This is desired not only because of the cost of the package, but also because there is demand for multi-chip modules (MCMs), in which multiple parts in die form are tested and assembled into a single unit. While there are various techniques proposed for testing, burning in and characterizing a singulated die, it would be advantageous to be able to "wafer map" the die prior to assembly with as many performance characteristics as possible. Ideally, one would want to be able to map the wafer with full device characterization.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{\text{Yield}} = C_{DIE} \times C_{ADDL.KGD}$$

where

C=cost $C_{DIE}$=manufacturing cost of functional die $C_{ADDL.\ KGD}$=additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(\text{number of die})}{\text{Yield}} \times C_{PACKAGE} = C_{DIE} \times C_{ADDL.KGD}$$

Note that again $C_{DIE}$ is not a factor in modules having identical part types; however, the equation must be modified to account for varied costs and yields of die in modules with mixed part types.

With MCMs, the cost of packaging a failed part is proportional to the number of die in the module. In the case of a ×16 memory array module, where probe-to-ship yield of the die is 95%, the costs are:

$$\frac{16}{0.95} \times C_{PACKAGE} = C_{ADDL.KGD}$$

so the additional costs of testing for known good die (KGD) may be 16 times the cost of testing an unrepairable module and still be economical. This, of course, is modified by the ability to repair failed modules.

Testing of unpackaged die before packaging into multichip modules would be desirable as it would result in reduced material waste, increased profits, and increased throughput. Using only known good die in MCMs would increase MCM yields significantly.

Testing unpackaged die requires a significant amount of handling. Since the test package must be separated from the die, the temporary packaging may be more complicated than either standard discrete packaging or multichip module (MCM) packaging. The package must be compatible with test and burn-in procedures, while securing the die without damaging the die at the bondpads or elsewhere during the process.

In U.S. Pat. No. 4,899,107, commonly assigned, a reusable burn-in/test fixture for discrete TAB die is taught. The fixture consists of two halves, one of which is a die cavity plate for receiving semiconductor dies as the units under test (UUT); and the other half establishes electrical contact with the dies and with a burn-in oven.

The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dies.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient to retain multiple die in a single test fixture.

Various forms of connections are used to connect the die to a package or, in the case of a multichip module (MCM), to other connections. These include wirebonding, TAB connections, bump bonding directly to substrate, and conductive adhesives.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

One of the problems encountered with burn in and full characterization testing of unpackaged die is the physical stress caused by connection of the bondpads to an external connection circuitry. This problem is complicated by the fact that in many die configurations, the bondpads are recessed below the surface level of a passivation layer. The passivation layer is a layer of low eutectic glass, such as BPSG, which is applied to the die in order to protect circuitry on the die. (The term "eutectic" does not, strictly speaking, apply to glass, which is an amorphous fluid; however, the term is used to describe the characteristic of some glasses wherein, as a result of their formulation, they readily flow at a given temperature.)

The ohmic contact between bondpads or test points on a die and a known good die test carrier package has been a matter of interest. It is difficult to achieve and maintain consistent ohmic contact without damaging the bondpads and passivation layer on the die. The design criteria of such contacts is somewhat different from the design criteria of the carrier package.

SUMMARY OF THE INVENTION

According to the present invention, probe tips are formed with projections which extend upward from a base. The probe tips establish electrical contact with bondpads or other contact locations on a surface such as a semiconductor die. In the case of bondpads on a semiconductor integrated circuit, the contact permits electrical communication between integrated circuit and external circuitry. The arrangement is suitable for flat bond pads or raised bump contacts.

In the preferred embodiments, the probe tips are formed on a substrate, and the substrate is formed from a material similar to that of the semiconductor integrated circuit die or wafer. In the case of silicon wafers, the substrate is formed from silicon material, thereby providing a coefficient of thermal expansion which matches that of the wafer. In one embodiment, the substrate is silicon, with one or more electrically isolating layers formed on the substrate. A plurality of raised conductors extend from the isolating layers and contact bondpads on the wafer. The conductive traces are in communication with the raised conductors in order to establish signal connections to perform the testing.

The intermediate substrate is preferably formed of a semiconductor material, and includes circuitry which is used to conduct signals between bondpad locations and external connector leads on the fixture. The substrate with circuitry is able to establish contact with the external connector leads, or with other leads on the fixture which are in communication with the external connector leads. In the preferred embodiment, the substrate is formed from silicon, although other semiconductor materials may be used. Examples of alternative materials include germanium and silicon on sapphire (SOS).

The substrate is formed with portions having increased height, such as bumps. These bumps, in turn, are formed with raised portions or points, so that the raised portion may penetrate the bondpad, while the remainder of the bump functions to limit penetration depth of the raised portion. This permits the penetration depth of the bump to be controlled by the physical dimensions of the raised portion. This results in the bumps being self-limiting in their penetration of the bondpads.

In a modification of the invention, a Z-axis anisotropic conductive interconnect material is provided as an interface between the substrate and the die. The Z-axis anisotropic conductive interconnect material is used to establish ohmic contact with bondpads or the equivalent attach points on the semiconductor die. The Z-axis anisotropic conductive interconnect material is able to conform to the shape of the die at the bondpad sufficiently to establish the ohmic contact without substantially damaging the bondpad. Since contact is able to be established by biasing force, it is possible to perform burn in and test of the die without resorting to bonding a conductor to the bondpad.

The Z-axis anisotropic conductive interconnect material is a metal filled polymer composite which is able to function as a compliant interconnection material for connector and testing applications. This material is in a group of materials which are referred to as elastomeric conductive polymer interconnect (ECPI) materials. These are available from AT&T Bell Laboratories, of Allentown, Pa., or Shin Etsu Polymer America Inc., of Union City, Calif., 3M Company of Minneapolis, Minn., at their Austin, Tex. plant or Nitto Denko America, Inc., San Jose, Calif. (a subsidiary of Nitto Denko Corporation of Japan).

The contact between the bondpads and the external connector leads is therefore established by utilizing the Z-axis anisotropic conductive interconnect material and substrate with circuitry. Conductors on the Z-axis anisotropic conductive interconnect material and substrate with circuitry extend from the bondpads to connection points, and the connection points conduct to contacts, which are in turn in communication with the external connector leads. The self-limiting nature of the bump is transferred through the Z-axis anisotropic conductive interconnect material so that the potential damage to the bondpad by force exerted through the Z-axis anisotropic conductive interconnect material is limited.

The various embodiments permit a substrate to be connected, through the contacts, to bondpads or testpoints on the die and conductors on the substrate. The connection may be permanent, or may be temporary. In the case of temporary connections, the contacts establish electrical contact with a wafer or a single die and with a burn-in oven, as well as permitting testing of dies in discretely packaged form. The contacts are thereby suitable for burn-in and testing of unpackaged die. In that application, after burn-in stress and electrical test, the wafer is removed from a test fixture and may be assembled in a conventional manner.

Connections of the substrate to the die may be effected through temporary carriers, such as described in U.S. patent application Ser. No. 8/073,003, filed Jun. 7, 1993, to Wood, Hembree, Doan and Farnworth, entitled, BONDPAD ATTACHMENTS USED TO TEMPORARILY CONNECT SEMICONDUCTOR DIE, and as described in U.S. patent application Ser. No. 08/046,675, filed Apr. 4, 1993, to Wood and Farnworth, entitled, CLAMPED CARRIER FOR TESTING OF SEMICONDUCTOR DIES. These patent applications are hereby incorporated by reference.

The Z-axis anisotropic conductive interconnect material may be placed in a wafer or die receiving carrier between the die and the contacts so that the ohmic contact with the bondpads or testpoints on the die may be established through the Z-axis anisotropic conductive interconnect material, through the substrate, to communicate with external connections.

DETAILED DESCRIPTION OF THE PREFERRED EMBODIMENT

Figure 1:
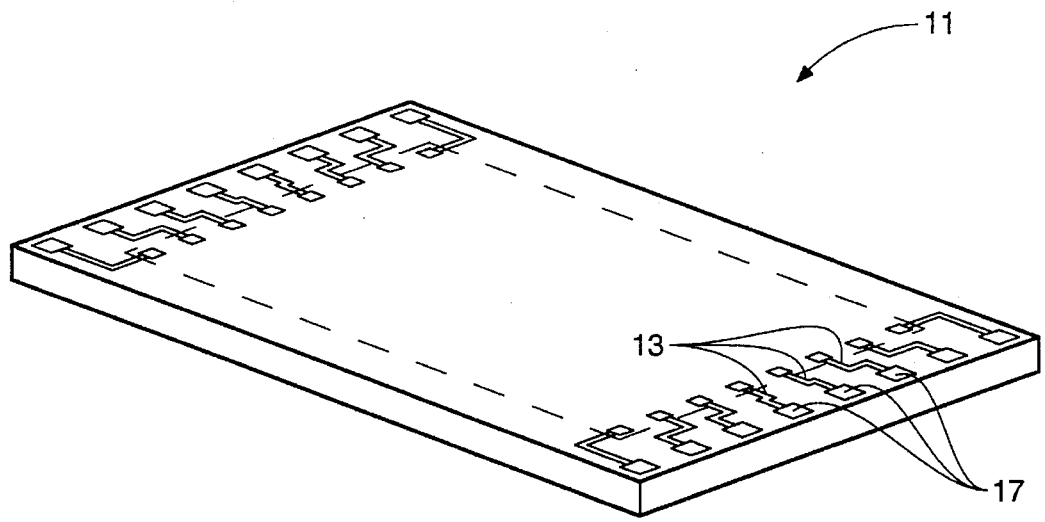
FIG. 1 shows a configuration in which a substrate has contact points for engaging bondpads on a semiconductor die.
Figure 2:
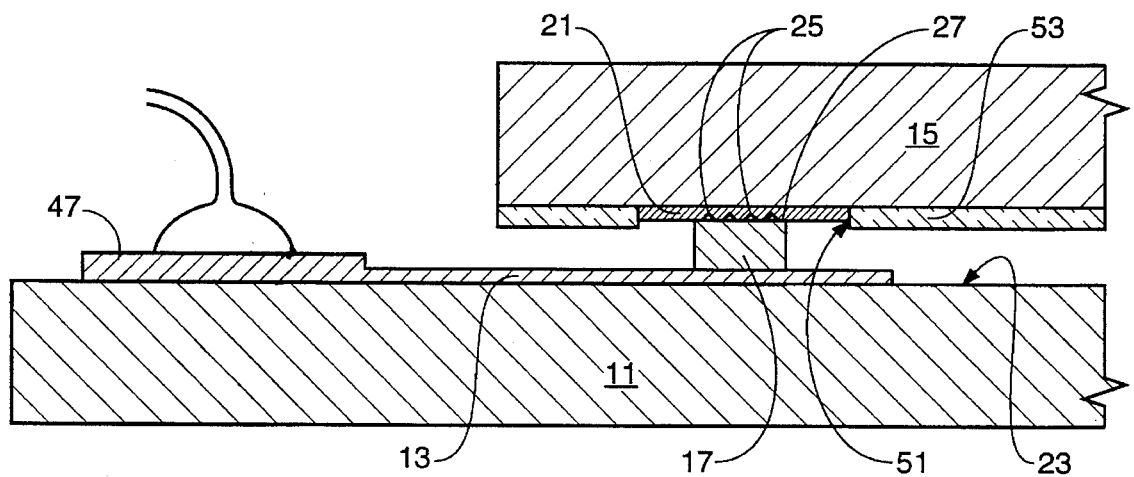
FIG. 2 shows details of a raised portion of a bump, wherein the bump may be self-limiting in its penetration of the bondpads.

Referring to FIGS. 1 and 2, a substrate 11 having conductive traces 13 supports a semiconductor die 15. The traces 13 terminate with contacts 17, which are in alignment with bondpads 21 or other contact point on the die 15. The bondpads 21 are typically 0.1 mm wide. As shown in FIG. 2, the contacts 17 are in actual contact with the bondpads 21, which is the preferred embodiment. Ohmic contact between the bondpads 21 and the contacts 17 is intended.

The substrate 11 is preferably formed of silicon or a material which matches that of the die 15. The conductive traces 13 are preferably on a top surface 23 of the substrate 11. The use of silicon or other semiconductor material for forming the substrate 11 permits the contacts 17 and conductive traces 13 to be formed on the substrate by semiconductor circuit fabrication techniques, such as those used to form conductive lines and bondpads on semiconductors integrated circuit devices. The substrate 11 may also be formed of other semiconductor process materials such as silicon on sapphire (SOS), silicon on glass (SOG) or semiconductor process materials using semiconductor materials other than silicon.

Semiconductor fabrication techniques are well-known to those skilled in the art. Such techniques are described in, Peter Van Zant, *Microchip Fabrication: A Practical Guide to Semiconductor Processing*, McGraw-Hill, 2nd ed., 1990, ISBN 0-07-067194-X.

The substrate 11 may be formed as a rigid, semirigid, semiflexible or flexible material. In the case of silicon, as the substrate material, it is possible to form the material thin enough that it is at least semiflexible. In the preferred embodiment, a rigid substrate is used. The rigidity is sufficient that, when the substrate 11 is aligned with the die 15, the height of the die contacts 17 nearly align in a Z axis direction with the bondpads 21 and that contact is established between the bondpads 21 and contacts 17 without the need to significantly distort the substrate 11. Typically such contact is achieved at all desired points by allowing the die contacts 17 to be depressed, or by the use of a Z-axis anisotropic conductive interconnect material (71, FIG. 5).

In order to establish such ohmic contact, the contact 17 must engage a significant portion of the bondpad 21. In the case of noble metal bondpads 21, this is merely a matter of surface area of contact, with a minimum of oxidation penetration necessary. In the case where the bondpad 21 has an oxide film, such as aluminum which develops an aluminum oxide film, the contact 17 must first penetrate the oxide film prior to conductively contacting the bondpad 21. In the preferred embodiments of this invention, this is accomplished by vertically penetrating into the bondpad 21 so as to break through or push aside the oxide.

In establishing the contact between the contacts 17 and bondpads 21, it is important to establish such contact with all of the bondpads 21 selected for contact. That requires that contact be applied more-or-less uniformly through all contacts 17 across the substrate. Some of the uniform contact is obtained by controlling forces applied to the substrate 11, planarity of the substrate 11 and supporting carrier (not shown) and the flexibility of the substrate 11. To the extent that uniform force is not applied, either through force applied to the individual contacts 17 or as a result of geometric misalignment, the contacts 17 may either over-penetrate the bondpads 21 or not establish sufficient ohmic contact with the bondpads 21.

In order to provide a more uniform force applied to the bondpads 21, this invention relies on the geometry of the contacts 17, as will be described in connection with FIG. 2. The contacts 17 on the substrate 11 may be formed with raised portions 25. The raised portions 25 may penetrate the bondpad 21, while the remainder 27 of each contact 17 functions to limit penetration depth of the raised portion 25. This permits the penetration depth of the contact 17 to be controlled by the physical dimensions of the raised portion 25. This results in the contacts 17 being self-limiting in their penetration of the bondpads 21, since the force required to cause the raised portion 25 to penetrate the bondpad 21 is significantly less than the force required for the remainder of the contact 27 to penetrate the bondpad 21.

The result is the raised portion 25 causes an indentation in the bondpad 21 but the indentation preferably is less than the thickness of the bondpad 21. The remainder of the bondpad beneath the contact 17 may be slightly distorted, but remains fully workable in subsequent assembly operations. For subsequent assembly operations, the bondpad 21 may be treated as if it were undamaged, and therefore the bondpad is considered not to be significantly damaged.

The ratio of force will vary according to materials and dimensions, but ratios of at least 2:1 permissible force to required force are expected. If the percentage of the contact 17 which is raised (raised portion 25) is sufficient, higher ratios, such as 4:1, 10:1 and greater may be expected. This is significant because variations in planarity may be expected on the substrate 11 and the die 15.

Figure 3:
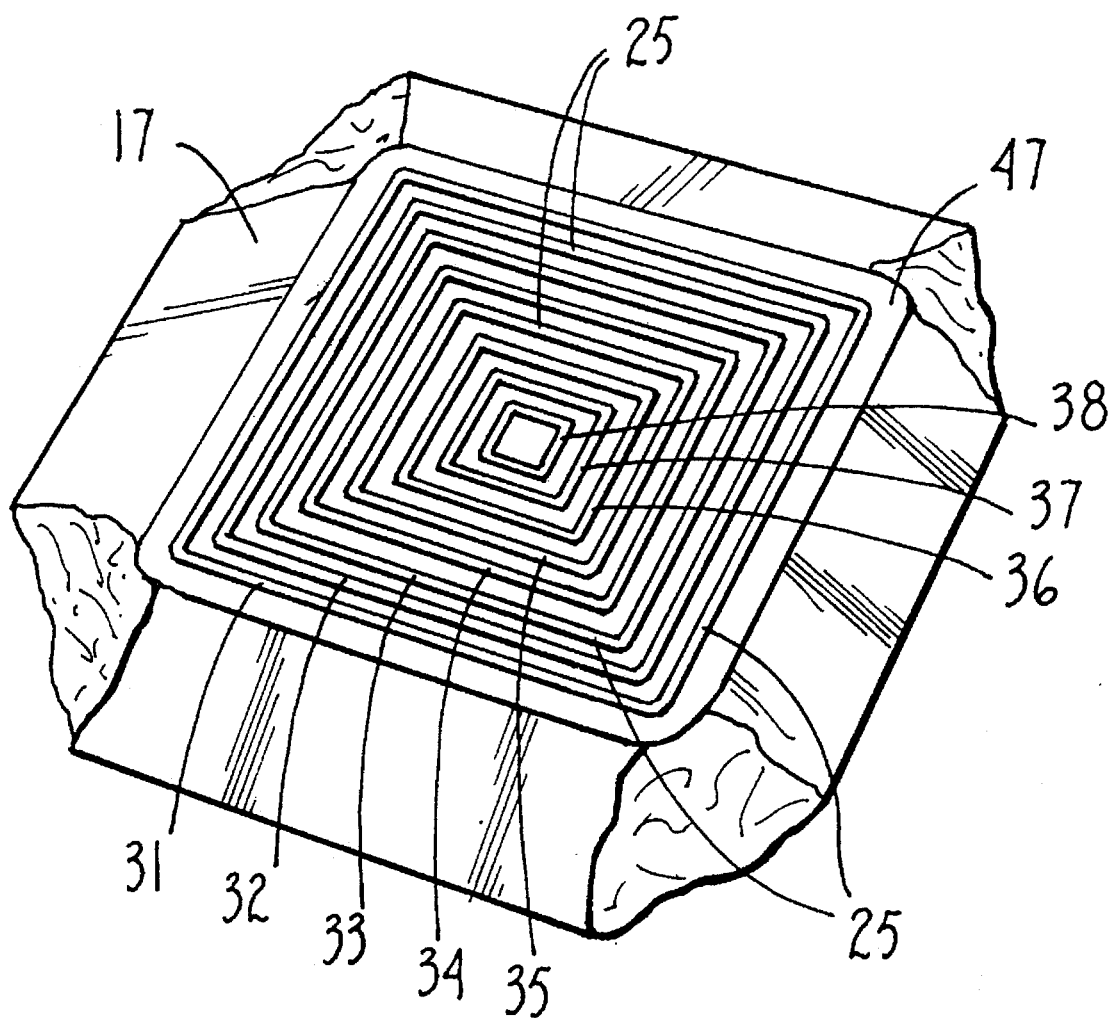
FIG. 3 is a drawing of a scanned photomicrograph, showing details of a configuration in which a die contacting substrate has self-limiting bumps.

FIG. 3 shows details of a contact configuration. In this configuration, the raised portion 25 consists of a plurality of ridges 31–38 which project upwardly from a plateau 47 which forms the top of the contact 17. The plateau 47 forms the remainder 27 of each contact 17, as shown in FIG. 2. In the example shown, the ridges 31–38 are concentrically arranged, but it is also possible to form the ridges in other layouts. A typical bondpad 21 consists of conductive material such as aluminum, precious metal or copper approximately 1 μm thick. In the case of recessed bondpads, this is recessed below approximately 7000 Å (approximately 0.7 μm) of passivation material 51, established by a BPSG passivation layer 53 (FIG. 2).

In the preferred embodiment, the contact 17 is formed of semiconductor material, specifically single crystal silicon cut as a wafer (forming the substrate 11) in a crystalline plane having a Miller index of (100). The ridges 31–38 are formed by preferential (isotropic) wet etching. The preferred etch angle is approximately 55° from the horizontal. Other optimum angles would include 90° (110) silicon, and it is possible to form the ridges 31–38 without a defined angle of projection.

The raised portions of the contacts 25 are preferably formed by etching, and preferably by wet etching the wafer in a pattern which leaves the raised portion 25 at the original surface level of the wafer. The remainder of the contact 27 is level to which the surface of the wafer has been etched down from the raised portion 25, and is not the original height of the wafer. Subsequent to etching the wafer from the height of the raised portion 25, portions of the wafer forming the substrate 11 apart from the contacts 17 are etched to remove the raised portion from those regions.

This results in the raised portion of the contacts 25 remaining at a height of 2000 Å above the remaining portion of the contacts 27. The thickness of the bondpad is typically 1.0 μm to 1.5 μm. We have achieved a penetration to a depth of 5000 Å into the bondpads 21, partly as a result of compressive distortion of the bondpads 21 in the area of the bondpads 21 which were in alignment of the contacts 17. It is anticipated that the height of the raised portion 25 may be as low as 2 Å. It is also possible to provide a height of the raised portion which will penetrate a 200 Å thickness of the bondpad. It is desired that the raised portion 25 penetrate the thickness of the native aluminum oxide on the bondpad if the bondpad is made of aluminum.

Silicon nitride is deposited on the wafer. The contacts 17 are then masked and the silicon nitride is removed from the wafer, while covering the contacts 17 in a pattern which enables subsequent etching below square mesas forming the contacts 17. The area of the wafer other than the contacts is wet etched through the resulting nitride mask to reduce the height of the substrate 11 to 25 μm below the contacts 17. (The raised portions 25 are only 2000 Å, so whether the reference height of the contacts is at the raised portion 25 or the remaining portion 27 is insignificant.)

In our preferred embodiment, we desired a 75 μm clearance between the die 15 and the substrate 11. In order to accomplish this, a layer of undoped CVD (chemical vapour deposition) silicon oxide is deposited on the wafer and masked near the contacts 17. This oxide is then stripped and the wafer is stripped to remove a 50 μm layer of material, resulting in a 75 μm depth of the substrate 11 below the contacts 17, except in a few areas where the substrate 11 is only 25 μm below the contacts 17. The purpose of this depth is to clear possible particulates and separate the conductive portions of the substrate 11 from the die 15. Separation of the conductive portions of the substrate reduces inductive coupling and cross-talk. If the die 15 or substrate 11 distorts during attachment, the clearance permits the force applied through the substrate 11 to be applied at the contacts 17, permitting control of penetration of the bondpads 21. Since there are portions of the substrate 11 not fully etched, the clearance is provided from a substantial portion of the die 15, but not the entire die 15. The reduced clearance occurs in regions closely adjacent to the bondpads 21, where the clearance is 25 μm. It is possible to provide less clearance in those regions, since greater clearance is provided from a substantial portion of the die 15.

It is believed that a clearance of at least 20 μm is necessary to prevent contact interference as may result from particulate contamination. The first etch step provides a clearance of at least 25 μm outside the bondpad area. It is anticipated that in some environments, a clearance of at least 40 μm may be acceptable.

The oxide is then stripped and the traces 13 are made conductive either by metallization or conductive doping. In the preferred embodiment, metallization is sputter deposited on the wafer, which requires sloped sidewalls for the contacts 17. It is also possible to CVD deposit the metallization.

Alternatively, conductive doping can be used to form the conductive traces 13. Titanium nitride, metallization or another material with high surface conductivity should be used on at least the raised projections 25 to provide contact conductivity, especially if conductive doping is used to define the conductive traces 13.

In our experiments, in order to isolate the traces 13, a wafer saw is used to kerf cut the metallization layer. In the preferred embodiment, it is anticipated that separation of the metallized conductive traces 13 will be accomplished by photolithographic etching.

Kerf cutting can also be done with doped conductive traces 13, but it is believed that the doping of the traces 13 can be accomplished through a mask, thereby leaving isolation regions separating the traces 13. It is anticipated that other common semiconductor processes will be used to separate the traces 13, such as the formation of field oxide regions to separate the traces 13. At present, the conductive traces 13 are isolated from each other by kerf cuts to segment the conductive traces.

In the case of conductive doping, a channel stop implant may be used to separate the conductive traces 13. It is further anticipated that active circuitry may be incorporated in the substrate 11 in the future, and appropriate measures to isolate the components and traces 13 will be used.

Referring again to FIG. 2, the raised portion 25 penetrates the bondpad 21. In the event that oxide is present at the bondpad 21, the penetration of the raised portion 25 wedges the oxide aside, resulting in the raised portion 25 contacting conductive metal. The 55° angle is found to be acceptable for aluminum bondpads, where aluminum oxide must be pushed away from the contact area by the raised portion 25 penetrating the surface of the bondpad 21. A preferred ratio of horizontal area occupied by the raised portion 25 as compared to area occupied by the remaining portion 27 is 0.1, although it is anticipated that the preferred range is between 0.3 and 0.5. Since the projection which forms the raised portion 25 is angled, it is possible to have the raised portion 25 occupy 100%, or nearly so, of the contacts 17.

Figure 4:
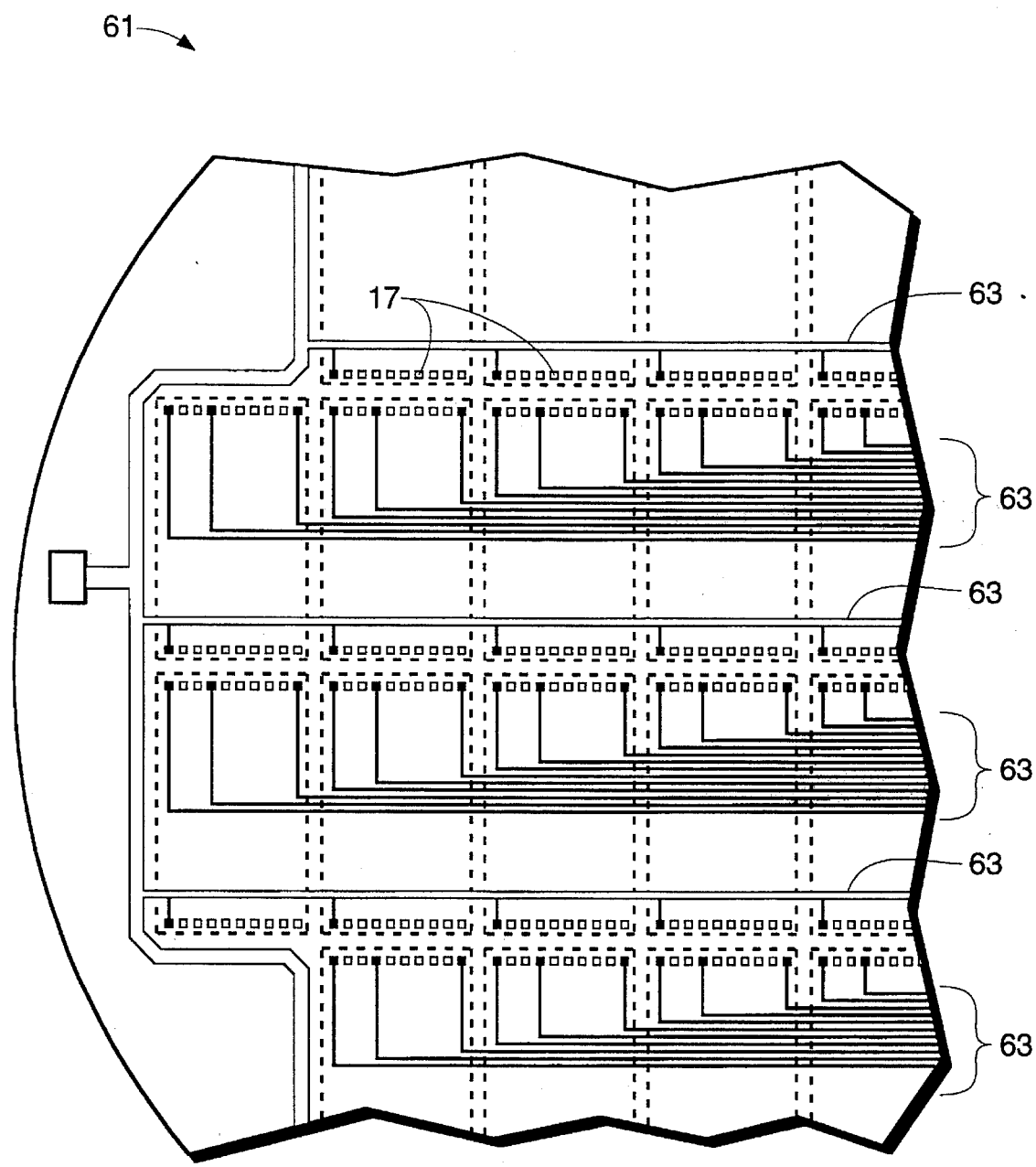
FIG. 4 shows the use of self-limiting bumps on a wafer scale substrate; and 15.

FIG. 4 shows the use of self-limiting contacts on a wafer scale contacting substrate 61. Since the substrate 61 is formed from similar material as a wafer to which the substrate 61 is mated, it is able to match coefficients of thermally induced expansion and the like with the wafer. The patterning of the substrate 61 in order to form its contacts 17 is effected by semiconductor photolithography in a manner which permits the mask layouts for the wafer to be utilized in designing the arrangement of the contacts 17 on the substrate. Circuit traces 63 are formed on the substrate 61 in order to connect the contacts 17 to external circuitry (not shown).

Figure 5:
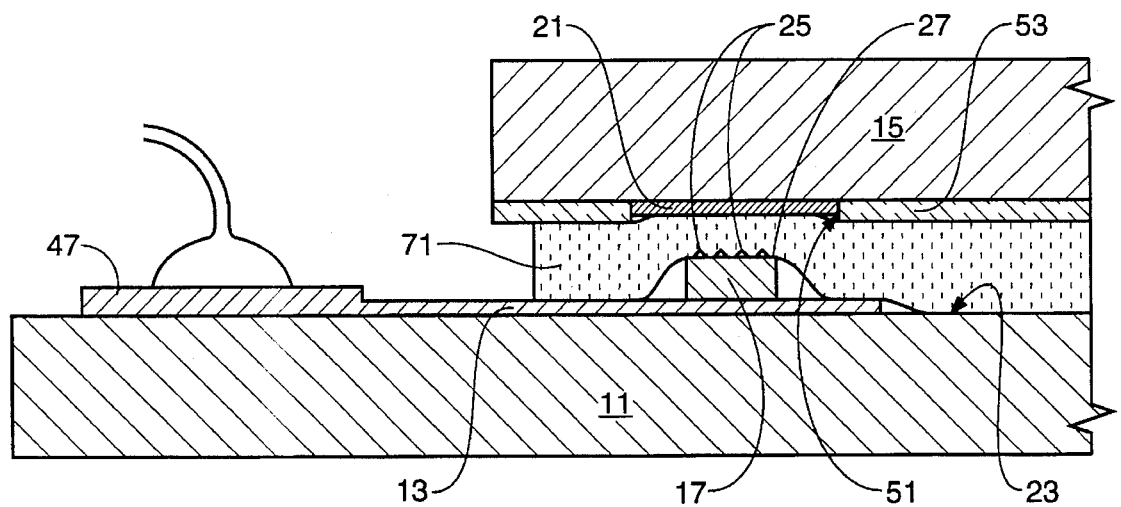
FIG. 5 shows details of Z-axis anisotropic conductive interconnect material and an intermediate substrate used with one embodiment of the invention.

FIG. 5 shows the use of a Z-axis anisotropic conductive interconnect material 71. The Z-axis anisotropic conductive interconnect material 71 functions as an interface between the substrate 11 and the bondpads 21.

The Z-axis anisotropic conductive interconnect material 71 is particularly useful in cases in which the bondpads 21 are recessed below a BPSG passivation layer 53 on the die 15. Other advantages of the Z-axis anisotropic conductive interconnect material 71 result from it being easily replaced when sequentially testing different dies 15 in the same package. The Z-axis anisotropic conductive interconnect material 71 is able to elastically deform in establishing ohmic contact with the bondpads 21, so that, under repeated testing, replacement of the substrate 11 may be required less often.

By using the contacts 17 of FIG. 5, the pressure applied against the die 15 and the bondpad 21 by the Z-axis anisotropic conductive interconnect material 71 may be controlled. It is anticipated that the Z-axis anisotropic conductive interconnect material 71 may be caused to selectively penetrate the bondpad 21 so that the Z-axis anisotropic conductive interconnect material 71 will cause an indentation in the bondpad 21 which is less than the thickness of the bondpad 21. It is also anticipated that the remainder of the bondpad 21 may be slightly distorted, but remains fully workable in subsequent assembly operations.

The area of the bondpad 21 where force is applied to establish ohmic contact by the Z-axis anisotropic conductive interconnect material 71 is thereby controlled by the raised portion 25 of the contacts 17.

As can be seen in FIG. 2, the bondpads 21 are in some cases recessed beneath the top surface of the die, as a result of the application of the passivation layer 53. The bondpads 21 also tend to be fragile. If the Z-axis anisotropic conductive interconnect material 71 is used to provide an interface between the bondpad 21 and the substrate 11, ohmic contact to be made through the Z-axis anisotropic conductive interconnect material 71, rather than directly between the substrate 11 and the bondpads 21. Conveniently, the Z-axis anisotropic conductive interconnect material is also able to extend between the substrate 11 and other connections (not shown), thereby also facilitating the connection of the substrate 11 to such other connections.

The use of the Z-axis anisotropic conductive interconnect material 71 between the bondpads 21 and the substrate 11 performs several functions. The ability of the Z-axis anisotropic conductive interconnect material to resiliently deform permits it to distort sufficiently to reach into the recesses defined by the bondpads 21. The compliant nature of the Z-axis anisotropic conductive interconnect material 71 permits ohmic contact to be made with the bondpads 21 with a minimum of damage to the bondpads. This is important in the burn in and testing of unpackaged die because it is desired that the bondpads remain substantially undamaged subsequent to burn in and testing. The compliant nature of the Z-axis anisotropic conductive interconnect material 71 permits an intermediate contact member such as the substrate 11 to be slightly misaligned with the bondpads 21. As long as there is a sufficient amount of material in the conductive path beneath the substrate 11 which is also in contact with the bondpads 21, ohmic contact will be established. It is also necessary to provide a biasing force to maintain ohmic contact.

Significantly, the Z-axis anisotropic conductive interconnect material 71 need not be permanently bonded to the bondpads 21. Ohmic contact is established by biasing force. This enables the Z-axis anisotropic conductive interconnect material 71 and substrate 11 to be lifted from the die 15 without destroying the bondpads 21.

It is also possible to permanently bond the Z-axis anisotropic conductive interconnect material 71 and the substrate 11 to the die 15, and to retain the attachment to the substrate 11 to the die 15 subsequent to burn in.

"Flip chip" optical alignment is used to align the die 15 with the substrate 11 with the contacts 17 aligned with the bondpads 21. Such equipment is available from Research Devices of Piscataway, N.J. The alignment system is usually used for flip chip die attachment, but functions sufficiently in the inventive capacity.

What has been described are specific configurations of contact plates and methods of forming these configurations. Such plates may be made with or without a clearance between the die 15 and the substrate 11. The substrate 11 may be formed to mate with a single die or an entire wafer. The inventive contacts may be used to contact items other than die bondpads. Clearly, modification to the existing apparatus can be made within the scope of the invention. Accordingly, the invention should be read only as limited by the claims.

What is claimed is:

1. A method for forming a contact member for establishing electrical contact with a contact location on a discrete, unpackaged semiconductor die, said contact location formed as a metal pad, said method comprising:

forming a substrate;

forming a contact on the substrate, said contact projecting from a surface of the substrate by a distance of from 20 μm to 75 μm to provide a clearance between the die and substrate;

forming a raised portion on the contact, said raised portion shaped as an elongated ridge projecting from a surface of the contact with a height of from 2 Å to 1.5 μm, for penetrating the contact location to a penetration depth that is less than a thickness of the contact location while the surface of the contact limits the penetration depth into the contact location; and forming a conductive trace on the substrate for transmitting signals to and from said contact to the contact location.

2. The method as claimed in claim 1 and wherein a plurality of raised portions shaped as elongated ridges are formed on the contact.

3. The method as claimed in claim 2 and wherein the elongated ridges are formed in a concentric pattern.

4. The method as claimed in claim 1 and wherein said raised portion is formed by etching the substrate.

5. The method as claimed in claim 4 and wherein said contact is formed as a plateau by etching the substrate around the raised portion.

6. The method as claimed in claim 5 and wherein said contact is formed by forming a mask on the substrate, etching the substrate around the raised portion to form the plateau and then removing the mask.

7. The method as claimed in claim 6 and wherein the raised portion is etched at an etch angle of approximately 55°.

8. The method as claimed in claim 7 and wherein the raised portion is formed by wet etching.

9. The method as claimed in claim 1 and wherein the substrate is formed of a material selected from the group consisting of silicon, germanium and silicon on sapphire.

10. The method as claimed in claim 1 and wherein the raised portion is formed as a pointed elongated ridge.

11. A method for forming a contact member for establishing electrical contact with a pattern of contact locations on a discrete, unpackaged semiconductor die, said contact location formed as a metal pad, said method comprising:

forming a substrate;

forming a first mask on the substrate;

etching the substrate around the mask to form a plurality of elongated ridges with each ridge projecting from the substrate with a height of from 2 Å to 1.5 μm for penetrating the contact location to a penetration depth that is less than a thickness of the contact locations;

forming a second mask on the substrate;

etching the substrate around each ridge to form a plurality of raised contacts in a pattern matching the pattern of contact locations, each contact projecting from a surface of the substrate by a distance of from 20 μm to 75 μm to provide a clearance between the die and substrate; and forming a conductive trace on the substrate for transmitting signals to and from said contact to the contact location.

12. The method as claimed in claim 11 and wherein each elongated ridge includes sloped sidewalls.

13. The method as claimed in claim 12 and wherein each contact includes a plurality of elongated ridges arranged in a concentric pattern.

14. The method as claimed in claim 13 and wherein the ridges are etched at an angle of approximately 55° using an isotropic wet etch process.

15. The method as claimed in claim 14 and wherein each contact is formed as a raised plateau with the ridges formed on a flat top surface of the plateau.

16. The method as claimed in claim 15 and wherein the conductive traces are formed using a metallization process.

17. The method as claimed in claim 16 and wherein the conductive traces are formed using a conductive doping process.

18. A method for forming a contact member for establishing electrical contact with a contact location on a discrete, unpackaged semiconductor die, said contact location formed as a metal pad, said method comprising:

forming a substrate;

forming a raised contact on the substrate for contacting the contact location, said raised contact formed with a height to provide a clearance between the substrate and the contact location of at least 20 μm;

forming a conductive trace on the substrate for transmitting signals to and from said contact to the contact location; and forming a raised portion on the contact, said raised portion shaped as an elongated ridge projecting from a surface of the contact with a height of from 2 Å to 1.5 μm, for penetrating the contact location to a penetration depth that is less than a thickness of the contact location while the surface of the contact limits the penetration depth into the contact location.

19. The method as claimed in claim 18 and wherein said raised portion is formed by etching the substrate.

20. The method as claimed in claim 19 and wherein said contact is formed as a plateau with a flat top surface by etching the substrate around the raised portion.

* * * * *